United States Patent [19]

Lloyd et al.

[11] 4,019,926
[45] Apr. 26, 1977

[54] PREVENTION OF CORROSION OF METALS

[75] Inventors: Geoffrey Oliver Lloyd, Twickenham; John Ernest Rhoades-Brown, Hanworth; Stuart Richard John Saunders, New Malden, all of England

[73] Assignee: The Secretary of State for Industry in Her Britannic Majesty's Government of the United Kingdom of Great Britain and Northern Ireland, London, England

[22] Filed: July 1, 1974

[21] Appl. No.: 485,017

[52] U.S. Cl. .......................... 148/6.35; 427/248 C; 427/248 E
[51] Int. Cl.² .......................................... C23F 7/04
[58] Field of Search .......... 117/129, DIG. 10, 70 R, 117/70 BC, 53, 23, 40; 427/255, 248, DIG. 10; 148/16, 16.7, 6.35, 6.3

[56] References Cited

UNITED STATES PATENTS

| 2,494,267 | 1/1950 | Schlesinger et al. | 117/DIG. 10 |
| 2,528,454 | 10/1950 | Schlesinger et al. | 427/DIG. 10 |
| 3,239,391 | 3/1966 | Harmon | 148/16.7 |

FOREIGN PATENTS OR APPLICATIONS

| 909,239 | 5/1969 | United Kingdom | 117/DIG. 10 |
| 959,533 | 6/1964 | United Kingdom | 117/DIG. 10 |

*Primary Examiner*—Ralph S. Kendall
*Attorney, Agent, or Firm*—Stevens, Davis, Miller & Mosher

[57] ABSTRACT

A method for the diminution of high temperature oxidation in an iron alloy containing chromium consisting of at least partially enclosing the alloy and a volatile inorganic boron compound, heating the boron compound and allowing the volatile constituent of the boron compound to contact at least one surface of the alloy.

6 Claims, No Drawings

PREVENTION OF CORROSION OF METALS

This invention relates to a process for the diminution of high temperature oxidation of iron alloys containing chromium and to articles made from said alloys protected by the method of the invention.

The expression 'high temperature oxidation' as used in this specification is defined as oxidation which occurs on surfaces of metal at temperatures in excess of about 400° C when the surfaces are in contact with air, carbon dioxide or other oxidising gases, for instance the gaseous products of combustion of coal or fuel oil.

This oxidation often forms protective layers by producing a barrier of oxide between the metal and the oxidising environment. The effectiveness of this barrier is reducing oxidation varies widely with different metals. Thick layers of oxide result in changes in dimensions and loss of strength, because of the conversion of metal to much weaker oxide.

Moreover these thick layers are likely to crack and flake as a result of temperature changes, and may even crack at constant temperature. Subsequent oxidation is usually rapid and may lead to the destruction of the metal in a short time. This high temperature oxidation does not include oxidation of metal surfaces at lower temperatures usually in the presence of water normally resulting in the formation of a scale of hydrated oxide. This type of oxidation, commonly known as rusting, does not form a protective coating so that the metal will be progressively consumed.

Many processes for controlling the growth of oxide are known and they include alloying with expensive materials such as chromium and nickel, and the application of protective barriers. Generally, if long term protection, a few months/years, is required thick barriers are required or large amounts of expensive alloying materials are necessary. These quick barriers may be vulnerable to mechanical damage. For short term protection, a few hours, a thinner deposit may be applied which while giving some protection may nevertheless permit the formation of a thick scale. This scale usually needs to be removed, or it may remove itself on cooling, but in any case one does not get long term protection by this method especially in conditions involving thermal cycling.

One process is disclosed in British Pat. Specification No. 1059277 which describes a method for scale-free heating of solid steel bodies by subjecting the body in an atmosphere including oxygen to the action of a heat source and to the action of a stream of boron introduced into the atmosphere as an isolated stream. The boron is introduced to the atmosphere through a volumetric pump and is combusted to form boric anhydride particles. These particles condense on the mill-scale of the steel and, as the temperature rises, melt, adhere to and flux with the iron oxide on the steel to form a thin, semi-molten, viscous film of ferrous or ferric borate on the steel surfaces. Thus relatively large quantities of boron compounds are needed to cover the surfaces. In this process, the steel to be protected is heated to temperatures of 850–1200° F which enables the boric anhydride to flux with the iron oxide of the mill-scale produced on the steel. This fluxing increases with increasing temperature until a film of ferrous or ferric borate is produced.

We have now found that iron alloys, containing chromium particularly alloys containing from about 5 to about 20 percent chromium, may be given protection against high temperature oxidation by enclosing or partially enclosing the alloy with a volatile inorganic boron compound, heating the boron compound and allowing the volatile constituents of the boron compound to contact at least one surface of the alloy.

According to the invention, there is provided a method for the diminution of high temperature oxidation in an iron alloy containing chromium comprising at least partially enclosing the alloy and a volatile inorganic boron compound, heating the boron compound and allowing the volatile constituent of the boron compound to contact at least one surface of the alloy.

Preferably, the chromium content of the alloy is between about 5 percent and about 20 percent by weight.

As used in this specification, the expression 'volatile boron compound' includes all compounds of boron which are known to produce a detectable deposit containing boron by transfer of material through the vapour phase in the conditions of the oxidation experiment. This expression includes borosilicate glasses, sodium metaborate, sodium tetraborate, boric acid, and borin oxide.

The processes of the invention confer excellent resistance to high-temperature oxidation, as previously defined, up to temperature of at least 900° C.

Various embodiments of the invention are known. In a first embodiment, the alloy and the inorganic compound are heated together to a temperature in the range about 400° to about 900° C.

In a further embodiment of the invention, the inorganic compound is heated by a supplementary heater to a higher temperature than the alloy. The alloy may initially be maintained at a lower temperature than the inorganic compound and be subsequently heated to its working temperature or may be heated to its working temperature from the start.

In either embodiment, the enclosure may be the final assembly containing the parts to be protected in high-temperature service or may be a temporary enclosure loaded with the parts for treatment.

When a source of volatile boron compound is installed in a finished assembly, it may form a permanent part of the installation, or may be withdrawn after sufficient boron compound has been transferred. When the source is independently heated, it may be energized for short or long periods as required to secure protection. A stream of gas may be circulated to distribute the boron compound widely and evenly.

Processes in which a source of low concentrations of volatile boron compound (eg a borosilicate glass) is permanently installed are particularly advantageous on account of the very small quantities of boron-containing material required and because any damage to the protective oxide film is rapidly repaired.

The alloys may be cleaned and degreased before exposure, but good results have been obtained without such preparation. The extent of the weight-gain before the highly protective oxide film develops depends to some extent on the initial surface finish.

A particular advantage of this process is that it makes it possible to produce a protective oxide film on articles which have already begun to oxidise rapidly in a non-protective atmosphere, without either removing the oxide already formed, or immersing in liquids.

A further advantage of the process according to the invention is that it can be applied to treat large, complex or inaccessible equipment either after fabrication or after deterioration has occurred in service.

The protective films are not broken by thermal cycling, and mechanical damage is repaired since the required small content of the protective additive is at all times present in the oxidising atmosphere.

In order that the invention may be better understood, it will be described, by way of illustration, by reference to the following examples which give details of tests actually carried out. All the tests were carried out in air in laboratory furnaces, using an iron alloy containing 10 percent chromium. Thicknesses of scale formed were estimated by weighing the specimens to measure the weight of oxygen taken up. A weight gain of 100 $\mu g/cm^2$ corresponds to a thickness of oxide of approximately 0.6 $\mu m$.

EXAMPLE 1

Strips of 10 percent chromium iron sheet were electropolished to a mirror finish and were exposed to flowing air at 600° C in a furnace tube of mullite in which a small quantity of "Pyrex" brand borosilicate glass (No. 774) had been melted at about 900° C to form a band about 1 cm wide around the inner surface in the central zone of the furnace. The specimens were mounted in a silica frame, and were not allowed to touch the wall of the tube. Weight gains were on average about 10 $\mu g/cm^2$ in periods up to 1 hour, increasing to about 20 $\mu g/cm^2$ in 28 days; the largest gains recorded in the entire series of experiments were about 50 $\mu g/cm^2$. Oxide films of this thickness correspond merely to a dulling of the initial highly polished specimen. Similar specimens oxidised in air in a furnace not treated with "Pyrex" glass gained about 4 mg/cm$^2$ in 6 days and 10-12 mg/cm$^2$ in 28 days. Complete destruction of the specimen corresponds to a gain of some 25 mg/cm$^2$.

Similar specimens oxidised in the "protected" furnace at 900° C gained about 3 mg/cm$^2$ in 24 hours. The oxide was adherent at temperature but spalled on cooling. A specimen in a non-protected furnace was completely consumed within 24 hours. Cold-rolled and abraded specimens of the same sheet material were exposed in flowing air in the protected furnace at 600° C. Weight-gains in the first 24 hours averaged about 200 $\mu g/cm^2$. After 21 days, this increased to only 280 $\mu g/cm^2$.

EXAMPLE 2

Strips of the same alloy were electropolished to a mirror finish and were oxidised in a silica frame surrounded by a cylinder of borosilicate glass (Pyrex glass No. 774) about 2 cm in diameter. The glass was flame-polished after cutting. It was secured by gold wire to the silica specimen holder, and was allowed to touch neither the specimens nor the Mullite furnace tube. Weight-gains after 3 days in flowing air at 600° C averaged 60 $\mu g/cm^2$, the largest weight-gain in a large batch of specimens being 230 $\mu g/cm^2$. Weight-gains in the same furnace-tube before the use of the "Pyrex" glass cylinder were about 480 $\mu g/cm^2$ in three days at 600° C. After dismantling the specimen holder, and removing the glass cylinder, a further batch of specimens of the same alloy showed weight-gains at least as low as those obtained in the presence of the glass. Baking out the furnace-tube at 1300° C for 3 days restored the normal non-protective oxidation behaviour.

EXAMPLE 3

Strips of the same alloy in the cold-rolled and abraded condition were placed in a furnace at 600° C for 64 hours, after which the weight-gain was about 600 $\mu g/cm^2$. These specimens were then placed in a frame which contained similar specimens freshly coated with borax, and the frame was transferred to a furnace at 800° C. The coated specimens had received deposits of varying thickness, but the total weight of borax applied was about 3 mg. The borax-coated specimens were within a few centimetres of the uncoated specimens. Weight-gains on the uncoated specimens averaged 1100 $\mu g/cm^2$ in the first 18 hours at 800° C, but formation of oxide then virtually ceased, and after 5,600 hours at 800° C the further weight-gain was only about 700 $\mu g/cm^2$. Untreated specimens would have been completely converted to oxide within 48 hours at 800° C (weight-gain about 25 mg/cm$^2$). The gain in weight of these specimens was considerably less than that of other specimens in the frame, which were, of course, coated with borax, so that they were protected by the method specified in Patent Application 49460/72. All these specimens were subjected to repeated temperature-cycling between 800° C and room temperature, when the specimens were withdrawn from the furnace for weighing.

What we claim is:

1. A method for the diminution of high temperature oxidation in an iron alloy containing from 5% to 20% by weight of chromium comprising,
   at least partially enclosing in a oxygen-containing atmosphere said alloy and a volatile inorganic boron compound physically separate from said alloy and selected from the group consisting of borosilicate glasses, sodium metaborate, sodium tetraborate, boric acid, and boric oxide,
   treating said boron compound to a temperature sufficient to volatilize at least a component of said volatile inorganic boron compound and
   contacting said volatilized component with at least one surface of said alloy at a temperature within the range of 400° C to 900° C, whereby a boron-containing oxide film is formed on the said at least one surface which protects said surface from further oxidation.

2. A method according to claim 1 wherein the alloy and the volatile inorganic boron compound are heated together to a temperature in the range about 400° to about 900° C.

3. A method according to claim 1 wherein the volatile inorganic boron compound is a borosilicate glass.

4. A method for the diminution of high temperature oxidation of iron alloys containing from 5% to 20% by weight of chromium forming part of an at least partially enclosed assembled apparatus and heated to at least 400° C by
   enclosing within said apparatus a volatile inorganic boron compound selected from the group consisting of borosilicate-glasses, sodium metaborate, sodium tetraborate, boric acid and boric oxide physically separate from said alloy, and at least intermittently heating said volatile inorganic boron compound to a temperature sufficient to volatilize at least a component thereof and
   contacting said component with an exposed surface of said alloy, whereby a boron-containing oxide film is formed on said surface which protects it from further oxidation.

5. A method according to claim 1 wherein the inorganic boron compound is heated by a supplementary heater to a higher temperature than the alloy.

6. A method according to claim 4 wherein the alloy and the volatile boron compound are both heated to a temperature in the range 400° to 900° C.

* * * * *